United States Patent [19]

Stokes et al.

[11] Patent Number: 4,707,631
[45] Date of Patent: Nov. 17, 1987

[54] ISOTROPIC ACOUSTIC WAVE SUBSTRATE

[75] Inventors: Robert B. Stokes, Torrance; Kuo-Hsiung Yen, Manhattan Beach; Kei-Fung Lau, Harbor City; Reynold S. Kagiwada, Los Angeles; Michael J. Delaney, Lomita, all of Calif.

[73] Assignee: TRW Inc., Redondo Beach, Calif.

[21] Appl. No.: 886,457

[22] Filed: Jul. 17, 1986

Related U.S. Application Data

[62] Division of Ser. No. 580,495, Feb. 15, 1984.

[51] Int. Cl.$^4$ ............................................. H01L 41/08
[52] U.S. Cl. .............................. 310/313 A; 310/313 B; 333/154; 333/195
[58] Field of Search ........... 310/313 R, 313 A, 313 B, 310/313 C, 360; 333/150-155, 193-196

[56] References Cited

U.S. PATENT DOCUMENTS

| | | |
|---|---|---|
| 3,919,669 | 11/1975 | Hartemann ................. 310/313 B X |
| 4,019,074 | 4/1977 | Shibayama et al. ................ 310/360 |
| 4,049,982 | 9/1977 | Cohen ............................ 310/313 B |
| 4,063,198 | 12/1977 | Wagers et al. .............. 310/313 B X |
| 4,066,984 | 1/1978 | Stern ........................... 310/313 B X |
| 4,126,800 | 11/1978 | Shiokawa et al. .............. 310/313 B |
| 4,159,435 | 6/1979 | Lewis .................................... 310/313 |
| 4,203,082 | 5/1980 | Tsukamoto et al. ............ 310/313 B |
| 4,409,571 | 10/1983 | Milsom et al. ................... 310/313 A |

Primary Examiner—Mark O. Budd
Attorney, Agent, or Firm—Noel F. Heal

[57] ABSTRACT

A surface acoustic wave (SAW) diffraction-effect or interference-effect device with a highly isotropic substrate having a high coupling coefficient and low attenuation losses. The use of X-propagating rotated-Y-cut lithium niobate as the SAW substrate, with the Y rotation angle selected at 121 degrees, provides a practically isotropic material, with a high coupling coefficient and relatively low attenuation losses.

1 Claim, 2 Drawing Figures

ISOTROPIC ACOUSTIC WAVE SUBSTRATE

This is a division of application Ser. No. 580,495, filed Feb. 15, 1984.

BACKGROUND OF THE INVENTION

This invention relates generally to acoustic wave devices, and more particularly, to substrate materials for use in surface acoustic wave (SAW) devices. These devices employ substrates of a piezo-electric material, across which elastic surface waves are propagated between sets of electro-acoustic transducers disposed on the substrate surface. The devices employ so-called Rayleigh waves, which can be propagated along a free surface of a solid, and have an amplitude of displacement that is largest right at the substrate surface. In a piezoelectric material, deformations produced by such waves induce local electric fields, which are propagated with the acoustic waves and extend into space above the surface of the material. These electric fields will interact with electrodes disposed on the surface of the material, to serve as electrical input and output transducers for the surface acoustic wave device.

Substrates for SAW devices are usually highly anisotropic in nature, i.e. the velocity of wave propagation varies strongly with the direction of propagation. SAW devices, therefore, usually employ a single direction of wave propagation.

It is well known that surface acoustic waves behave analogously to light waves in many respects. In particular, interference and diffraction effects in optics have counterparts in surface acoustic wave technology. However, SAW devices employing principles of interference or diffraction are required to transmit waves in more than one direction. If the SAW substrate is anisotropic, the only way to implement interference or diffraction devices in SAW technology is by compensating for the velocity differences by appropriate positioning of the transducers. This approach is used, for example, in apparatus disclosed in a copending application of Robert E. Brooks, Ser. No. 529,066, filed on Sept. 2, 1983, and entitled "Signal Processing System and Method."

If diffraction and interference effects can be exploited directly in SAW devices, powerful signal processing functions may be implemented, such as spectrum analysis and Fourier transformation. Ideally, however, these functions require almost perfectly isotropic substrates, to permit the use of transducer patterns that are acoustically correct for a wide range of propagation directions at each point on the surface. Lead zirconium titanate (PZT) and zinc oxide (ZnO) are horizontally isotropic materials that have been available for this purpose, but their performance at high frequencies, above 60 megahertz (MHz), is poor. Trigonal materials that are in most respects highly suitable for use in SAW devices, such as quartz and lithium niobate ($LiNbO_3$), have long been known to be highly anisotropic in nature, and hence not suitable for devices employing diffraction or interference principles. Specific cuts of lithium niobate crystals have been recognized as being less likely to propagate bulk shear waves. For example, U.S. Pat. No. 4,409,571 to Milson et al. is concerned with selection of lithium niobate to minimize bulk waves.

It will be appreciated from the foregoing that there is a need for a high-quality isotropic SAW substrate, having low propagation loss, low cost, a high coupling coefficient, and excellent uniformity. Preferably, these desirable properties should also be obtainable at high frequencies. The present invention fulfills this need.

SUMMARY OF THE INVENTION

The present invention resides in the use of a substrate material of X-propagating, 121-degree Y-rotated-cut lithium niobate, to minimize anisotropy. Basically, the invention is a structure for use in a two-dimensional diffraction-effect or interferenceeffect surface acoustic wave (SAW) device. The structure comprises a SAW substrate of X-propagating rotated Y-cut lithium niobate ($LiNbO_3$) having a Y rotation angle of approximately 121 degrees, and a plurality of electro-acoustic transducers disposed on a surface of the substrate at angles that may differ substantially from the principal X propagation direction.

The invention may also be expressed as a method of manufacturing surface acoustic wave (SAW) diffraction-effect or interference-effect devices. Basically the method comprises the steps of cutting a crystal of X-propagation lithium niobate ($LiNbO_3$) at a rotated-Y-cut angle of approximately 121 degrees, to form a SAW substrate, and forming a plurality of electro-acoustic transducers on a surface of the substrate, aligned to transmit or receive acoustic waves propagated at various angles that may differ substantially from the principal X propagation direction.

For the specific cut of lithium niobate required by the invention, the SAW velocity varies by only about 25 parts per million for angles of propagation between $+5$ and $-5$ degrees of the X axis. Moreover, the coupling coefficient is relatively high for SAW devices, and the material can be produced at relatively low cost.

It will be apreciated from the foregoing that the present invention represents a significant advance in the field of SAW devices. In particular, the invention provides a substrate material that is practically isotropic, but also has a high coupling coefficient and low losses, and can be made at relatively low cost. Other aspects and advantages of the invention will become apparent from the following more detailed description, taken in conjunction with the accompanying drawings.

DESCRIPTION OF THE PREFERRED EMBODIMENT

Figure 1:
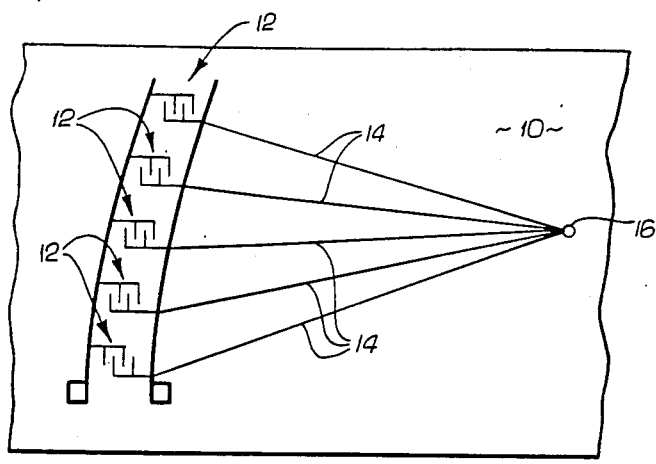
FIG. 1 is a plan view of a portion of a substrate having multiple transducers for propagating surface acoustic waves in different directions.

As shown in the drawings for purposes of illustration, the present invention is concerned with surface acoustic wave (SAW) devices. The most useful and widely used substrate materials for SAW devices are anisotropic, meaning that their elastic properties are not the same for all directions of wave propagation. Specifically, the velocity of wave propagation varies strongly with the direction of propagation. For this reason, SAW devices have not been widely used as diffraction-effect or interference-effect devices, since these require either almost perfect isotropy, or the use of elaborate compensation techniques.

In accordance with the invention, a specific cut of lithium niobate is used as the substrate material, to obtain practically perfect isotropy over a fairly wide range of propagation directions. FIG. 1 shows a SAW substrate, indicated by reference numeral 10, and a plurality of transducers 12 disposed on a surface of the substrate 10 to transmit surface acoustic waves propagated in different directions with respect to a principal direction of propagation. By way of example, the transducers 12 may be relatively small in size, and may function as point sources of acoustic energy. The lines 14 in FIG. 2 indicate propagation paths to a focal point 16. This is the type of configuration used in a diffraction device. The transducers 12 may, of course, be aligned in specific directions for some applications of diffraction-effect or interference effect devices.

The SAW velocity of propagation for rotated Y-cut, X-propagating lithium niobate can be expressed approximately as a quadratic function of the propagation angle, as follows:

$$V = V_0(1 + (\gamma/2)\emptyset^2),$$

where $\emptyset$ is the deviation from the X-axis direction in radians, $V_0$ is the velocity in the X-axis direction, and $\gamma$ is the anisotropy coefficient. For a zero anisotropy coefficient, the angle of propagation direction has no effect on the propagation velocity.

Figure 2:
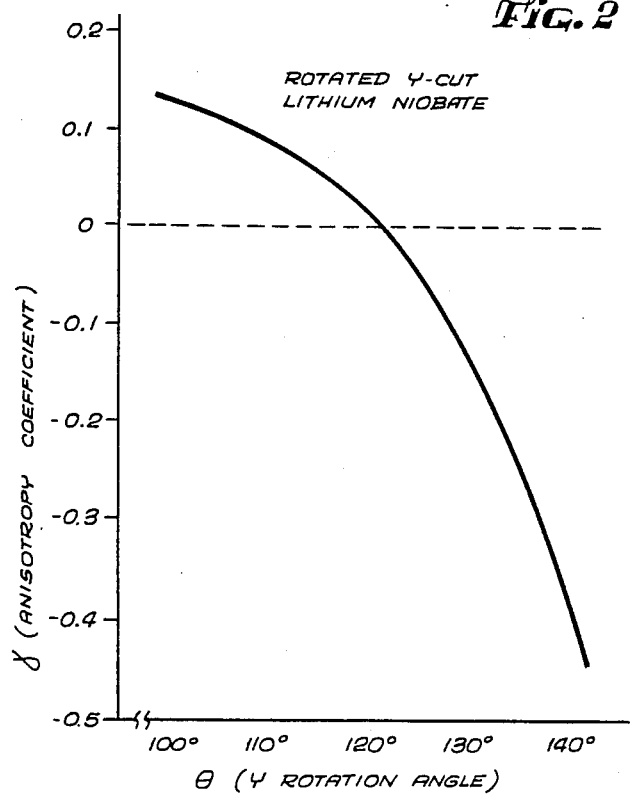
FIG. 2 is a graph showing the anisotropy coefficient as a function of Y rotation cut angle in lithium niobate.

FIG. 2 shows how the anisotropy coefficient varies with the angle of Y-rotated cut in X-propagating lithium niobate. The coefficient passes through zero at a rotation angle of 121 degrees. For this angle of cut, the velocity of propagation varies by only about 25 parts per million over a range of propagation directions between +5 and −5 degrees with respect to the X axis. The coupling coefficient $k^2$ is approximately 4.3% for this cut of lithium niobate, which is a relatively high value for SAW substrates. Also, lithium niobate has a relatively low attenuation loss, approximately 2.6 dB/cm at 1 GHz. Moreover, since lithium niobate is routinely grown in large boules, the substrate of the invention can be produced at relatively low cost.

It will be appreciated from the foregoing that the present invention represents a significant advance in the field of surface acoustic wave devices. In particular, the invention provides for the first time an isotropic substrate material with low losses and a high coupling coefficient. The material can, therefore, be used in diffraction-effect and interference-effect devices without the need for cumbersome compensation techniques. It will also be appreciated that, although the invention has been described in detail for purposes of illustration, modifications may be made that are still within the scope of the appended claims.

We claim:

1. For use in a two-dimensional diffraction-effect or interference-effect surface acoustic wave (SAW) device, a structure comprising:
    a substantially isotropic SAW substrate of X-propagating rotated Y-cut lithium niobate ($LiNbO_3$) having a Y rotation angle of approximately 121 degrees; and
    a plurality of electro-acoustic transducers disposed on a surface of said substrate at substantially different angles relative to the principal X propagating direction, thereby directly exploiting the diffraction or interference properties of acoustic waves.

* * * * *